US007938506B2

(12) United States Patent
Kanemoto

(10) Patent No.: US 7,938,506 B2
(45) Date of Patent: May 10, 2011

(54) INKJET RECORDING HEAD, INKJET RECORDING DEVICE, AND METHOD FOR MANUFACTURING THE INKJET RECORDING HEAD

(75) Inventor: Kei Kanemoto, Suwa (JP)

(73) Assignee: Seiko Epson Corporation (JP)

( * ) Notice: Subject to any disclaimer, the term of this patent is extended or adjusted under 35 U.S.C. 154(b) by 187 days.

(21) Appl. No.: 12/399,340

(22) Filed: Mar. 6, 2009

(65) Prior Publication Data

US 2009/0237454 A1 Sep. 24, 2009

(30) Foreign Application Priority Data

Mar. 24, 2008 (JP) ................................ 2008-076377

(51) Int. Cl.
*B41J 2/135* (2006.01)
*B41J 2/045* (2006.01)
*H01L 41/22* (2006.01)

(52) U.S. Cl. ............................ 347/47; 347/68; 29/25.35

(58) Field of Classification Search ........................ None
See application file for complete search history.

(56) References Cited

U.S. PATENT DOCUMENTS 6,378,996 B1 4/2002 Shimada et al.
6,502,930 B1 1/2003 Shimada et al.
7,572,730 B2 * 8/2009 Kojima ......................... 438/667
7,641,321 B2 * 1/2010 Takahashi ....................... 347/68
2007/0146440 A1 6/2007 Kojima et al.

FOREIGN PATENT DOCUMENTS

JP 2001-162794 6/2001
JP 2001-205808 7/2001
JP 2001-205815 7/2001
JP 2007-176079 7/2007

* cited by examiner

*Primary Examiner* — Omar Rojas

(74) *Attorney, Agent, or Firm* — Harness, Dickey & Pierce, P.L.C.

(57) ABSTRACT

In a method for manufacturing an inkjet recording head which includes a pressure generation chamber supplied with ink fluid and a nozzle opening leading to the pressure generation chamber, the method includes: (a) forming a first trench which serves as the pressure generation chamber on a first surface of a first substrate; (b) forming a second trench which serves as the nozzle opening on a bottom surface of the first trench; (c) forming a sacrificial film on the first trench and the second trench; (d) forming a diaphragm on the sacrificial film as well as on the first surface of the first substrate; (e) forming a piezoelectric element on the diaphragm; (f) grinding a second surface of the first substrate so as to open a bottom surface of the second trench; (g) forming an opening which exposes the sacrificial film on the first surface of the first substrate; and (h) removing the sacrificial film through the opening.

6 Claims, 7 Drawing Sheets

INKJET RECORDING HEAD, INKJET RECORDING DEVICE, AND METHOD FOR MANUFACTURING THE INKJET RECORDING HEAD

BACKGROUND

1. Technical Field

The present invention relates to an inkjet recording head, methods for manufacturing the same, and an inkjet recording device, particularly to techniques which prevent clogging of nozzle openings caused by adhesives.

2. Related Art

As shown in FIG. 7A, an inkjet recording head 200 according to an example of related art includes a piezoelectric element (in other words, piezo element) 201, a driver circuit 203 for driving the piezoelectric element, a sealing plate 205 for sealing the piezoelectric element, a reservoir 207 that is externally supplied with ink fluid, a substrate 210 having a diaphragm 209 and a pressure generation chamber 211, and a nozzle plate 220 in which a nozzle opening 213 is formed. As shown in FIG. 7B, the above components are bonded together with an adhesive, and the piezoelectric element 201 and the driver circuit 203 are connected with wire bonding, thereby building up this inkjet recording head 200.

In recent years, nozzle openings are arranged in greater density, and connecting the piezoelectric element 201 and the driver circuit 203 with wire bonding is reaching its technical limits. Following such a trend, methods are disclosed so as to form driver circuits directly on the substrates and sealing plates. For examples, refer to JP-A-2001-205815 and JP-A-2001-162794. In order to connect piezoelectric elements and driver circuits, these methods use photolithographic wiring formation or flip chip mounting, thereby achieving fine connections compared to the case of wire bonding. Consequently, nozzle openings can be arranged in greater density.

The methods disclosed above, however, may result in clogging of the nozzle openings due to the adhesives protruding beyond the bonding surface. The probability of occurrence of this problem is considered to increase as the diameter of the nozzle opening is reduced and the nozzle openings are arranged in greater density.

SUMMARY

An advantage of the invention is to provide a method for manufacturing an inkjet recording head that prevents clogging of nozzle openings caused by the adhesives, as well as to provide the inkjet recording head and an inkjet recording device.

According to a first aspect of the invention, in a method for manufacturing an inkjet recording head which includes a pressure generation chamber supplied with ink fluid and a nozzle opening leading to the pressure generation chamber, the method includes: (a) forming a first trench which serves as the pressure generation chamber on a first surface of a first substrate; (b) forming a second trench which serves as the nozzle opening on a bottom surface of the first trench; (c) forming a sacrificial film on the first trench and the second trench; (d) forming a diaphragm on the sacrificial film as well as on the first surface of the first substrate; (e) forming a piezoelectric element on the diaphragm; (f) grinding a second surface of the first substrate so as to open a bottom surface of the second trench; (g) forming an opening which exposes the sacrificial film on the first surface of the first substrate; and (h) removing the sacrificial film through the opening.

Here, it is preferable to use a film with higher etching selectivity relative to that of the first substrate as the sacrificial film (in other words, a film which is etched more easily than the first substrate). For instance, if the first substrate is made of silicon (Si), then the sacrificial film may either be a silicon oxide film ($SiO_2$) or a silicon germanium (SiGe) film. An example of the $SiO_2$ film as the sacrificial film may also include a phosphosilicate glass (PSG) film that has a relatively fast etching rate.

In this case, the method for manufacturing an inkjet recording head may further include (i) bonding a second substrate that has a recess in an area facing the piezoelectric element to the first surface of the first substrate, so as to seal the piezoelectric element in the recess.

In this case, the method for manufacturing an inkjet recording head may further include forming, in the second substrate, a reservoir that leads to the pressure generation chamber.

In this case, the method for manufacturing an inkjet recording head may further include (k) forming an integrated circuit on a bottom surface of the recess prior to step (i).

The above method allows for, for instance, arranging the second substrate on the first surface of the first substrate in order to seal the piezoelectric element as well as to form the reservoir. At the same time, the method allows for arranging an open end of the nozzle opening on the second surface of the first substrate. There is no need to arrange the second substrate on the second surface of the first substrate, and thus the second substrate is spaced away from the open end of the nozzle opening. Therefore, even if an adhesive protrudes out beyond the bonding surface between the first and the second substrates, it is possible to prevent the clogging of the nozzle opening caused by the excess adhesive. This allows for manufacturing the inkjet recording head in high yield.

In this case, the method for manufacturing an inkjet recording head may further include: forming a bump electrode on an active surface of the integrated circuit; and forming an interconnection connecting to one of a lower electrode and an upper electrode of the piezoelectric element. In step (i) of this method, the second substrate is bonded to the first surface of the first substrate in a state in which the bump electrode overlays the interconnection.

Such a method allows for connecting the integrated circuit and the piezoelectric element in a finer pitch with reduced thickness (fine connections) compared to the case of wire bonding, thereby contributing to a size reduction of the inkjet recording head.

In this case, in step (h) of the method for manufacturing an inkjet recording head, the sacrificial film is removed through the opening as well as through the bottom surface of the second trench opened on the second surface of the first substrate.

With this method, the sacrificial film is efficiently removed during the etching of the sacrificial film, since any one of an etching fluid and an etching gas is also supplied from the bottom surface of the second trench (i.e. the discharge orifice of the nozzle opening).

According to a second aspect of the invention, an inkjet recording head includes a first substrate, a diaphragm formed on a first surface of the first substrate so as to cover a pressure generation chamber, and a piezoelectric element formed on the diaphragm. In this inkjet recording head, the first substrate includes the pressure generation chamber supplied with ink fluid, and a nozzle opening leading to the pressure generation chamber. The pressure generation chamber is formed on the first surface of the first substrate, and the nozzle opening is formed extending from a bottom surface of the pressure generation chamber toward a second surface of the first substrate.

In this case, the inkjet recording head may further include a second substrate that has a recess in an area facing the piezoelectric element, and is bonded to the first surface of the first substrate, so as to seal the piezoelectric element in the recess.

This inkjet recording head prevents clogging of the nozzle opening caused by the adhesive.

According to a third aspect of the invention, an inkjet recording device includes the inkjet recording head according to the second aspect of the invention.

This inkjet recording device includes the inkjet recording head that prevents the clogging of the nozzle opening caused by the adhesive and contributes to reducing the price of the inkjet recording device since such inkjet recording heads are manufactured at a low cost and in high yield.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will now be described with references to the accompanying drawings. Elements with the same structure described in the below drawings are denoted by the same numerical symbols, and the descriptions thereof are omitted.

Figure 1:
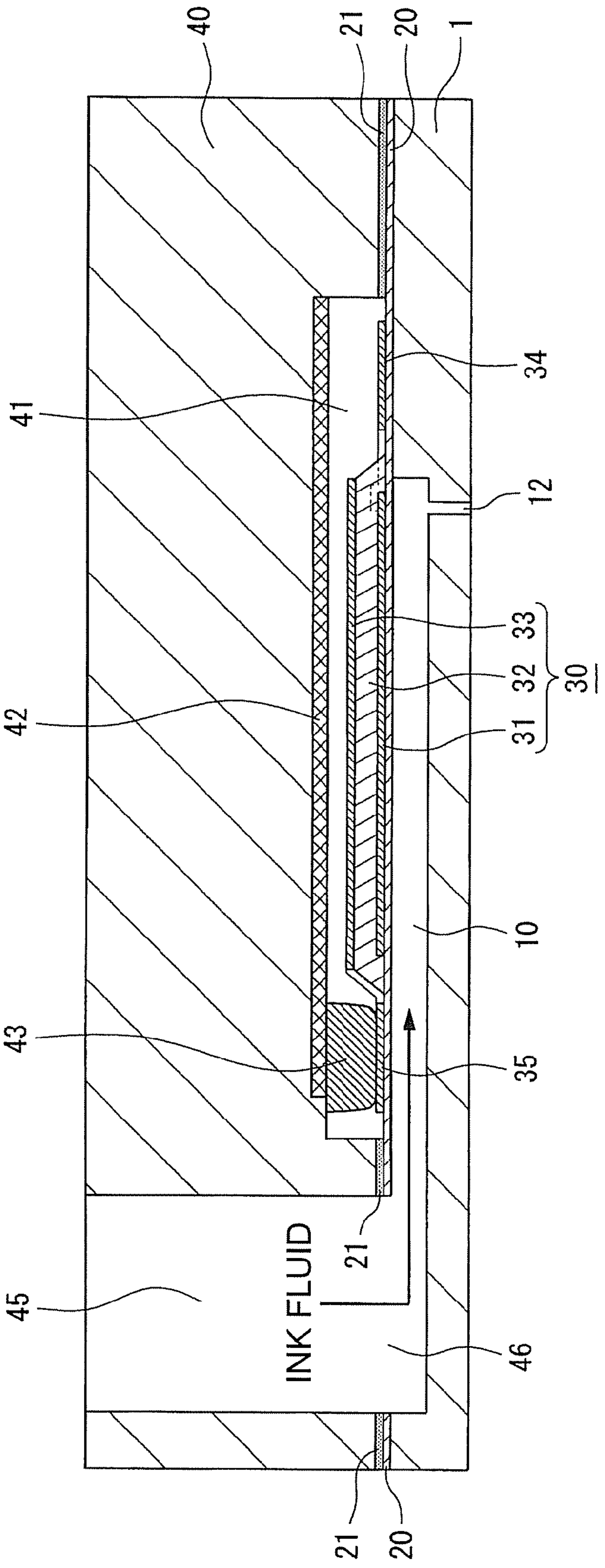
FIG. 1 is a drawing illustrating a structural example of an inkjet recording head according to an embodiment.

FIG. 1 is a sectional drawing illustrating a structural example of an inkjet recording head 100 according to an embodiment of the invention. As shown in FIG. 1, this inkjet recording head 100 includes, for instance, a substrate 1, a diaphragm 20, a piezoelectric element (i.e. piezo element) 30, and a sealing plate 40 that has a recess 41 in an area that faces the piezoelectric element 30.

The substrate 1 is a bulk silicon substrate with, for instance, a plane orientation of (100). This substrate 1 has, for instance, a thickness ranging from 150 μm to 1 mm, and includes a plurality of ink channels each formed as a separate compartment. Here, each of the ink channels is a route in which an ink fluid flows, and includes, as a part of the channel, a pressure generation chamber 10 and a nozzle opening 12 that leads to the pressure generation chamber 10. As shown in FIG. 1, the pressure generation chamber 10 is formed on the top surface of the substrate 1. The nozzle opening 12 is formed from a bottom surface of the pressure generation chamber 10 to a back surface of the substrate 1. A volume of the pressure generation chamber 10 that provides pressure to the ink fluid and the size of a nozzle opening 22 are optimized in accordance with the quantity, speed, and frequency of ink discharge.

The diaphragm 20 is an elastic film and is formed on the surface of the substrate 1 so as to cover the pressure generation chamber 10. The piezoelectric element 30 is formed directly above the pressure generation chamber 10 with the diaphragm 20 interposed therebetween. This piezoelectric element 30 includes a lower electrode 31, a piezoelectric body 32 formed on the lower electrode 31, and an upper electrode 33 formed on the piezoelectric body 32. Here, the piezoelectric element 30 is provided in plurality and the lower electrode 31 serves as, for instance, a common electrode that corresponds to the piezoelectric elements 30. The piezoelectric body 32 is a dielectric body that expands and contracts, or, is deformed upon applying a voltage, and is made of, for instance, lead zirconate titanate (PZT). Unlike the lower electrode 31, the upper electrode 33 is not a common electrode, and it serves as an electrode corresponding to each piezoelectric body. Each of the piezoelectric elements 30 is provided directly above the respective pressure generation chamber 10. Interconnections 34 and 35 that lead to each of the piezoelectric elements 30 are formed on the surface of the substrate 1. The interconnection 34 pulls out the lower electrode 31, and the interconnection 35 pulls out the upper electrode 33.

The sealing plate 40 is made of a bulk silicon substrate with, for instance, a plane orientation of (100). The recess 41 for sealing each of the piezoelectric elements 30 is provided on the surface of the sealing plate 40 in an area facing each of the piezoelectric elements 30. As shown in FIG. 1, the sealing plate 40 is bonded to the surface of the substrate 1 via an adhesive 21 and the like, and each of the piezoelectric elements 30 is sealed (in other words, tightly enclosed) inside the recess 41 in a state in which enough space is ensured so as not to inhibit the movement of the piezoelectric elements 30. A driver circuit 42 for driving the piezoelectric elements 30 is formed integrally to the bottom surface of the recess 41. A plurality of bump electrodes 43 is formed on the active surface (i.e. a circuit forming surface) of the driver circuit 42, and these bump electrodes 43 are electrically coupled to the interconnections 34 and 35. Moreover, a through hole is formed in the sealing plate 40 from the top surface to the back surface of the plate. This through hole is a reservoir 45 that is externally supplied with the ink fluid. The size of the reservoir 45 is large so that it has a volume sufficiently larger than the total volume of all the pressure generation chambers 10.

This inkjet recording head 100 retrieves the ink fluid from an unillustrated external ink supply unit into the reservoir 45, so as to fill the space between the reservoir 45 and the nozzle opening 22 with the ink fluid as shown in an arrow in FIG. 1. Thereafter, in accordance with the record signal from the driver circuit 42, a voltage is applied between the upper electrode 33 and the lower electrode 31 of each of the piezoelectric elements 30, so that the piezoelectric body 32 expands and contracts, or, is deformed. As a result, the diaphragm 20 is deformed and a pressure inside the pressure generation chamber 10 increases, thereby discharging the ink fluid from the nozzle opening 22.

A method for manufacturing the inkjet recording head 100 will now be described. FIGS. 2A to 6 are sectional drawings illustrating a method for manufacturing the inkjet recording head 100 according to another embodiment of the invention.

Figure 2A:
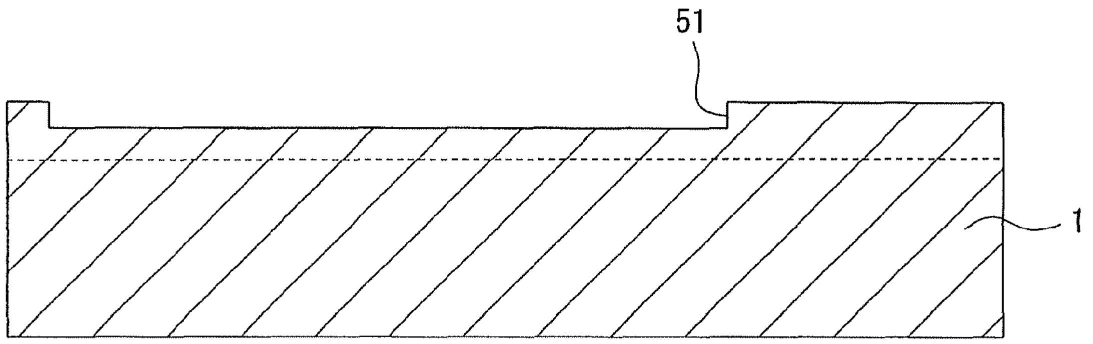
FIGS. 2A to 2C are drawings illustrating a method for manufacturing the inkjet recording head.
Figure 2B:
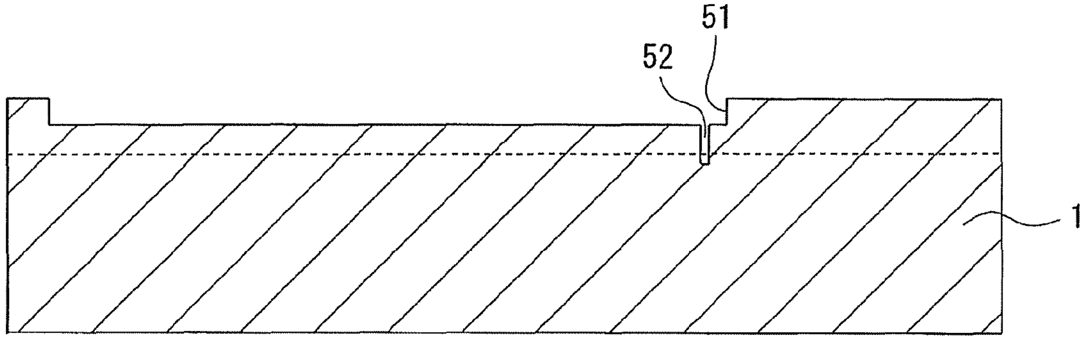

As shown in FIG. 2A, the substrate 1 that is made of, for instance, a bulk silicon, is prepared. Subsequently, the top surface of the substrate 1 is partially etched by techniques of photolithography and etching, so as to form a trench 51 in an area that is to become the ink channel. As shown in FIG. 2B, a trench 52 is then formed in an area that is to become the nozzle opening, by partially etching the bottom surface of the trench 51 with photolithography and etching techniques.

Figure 2C:
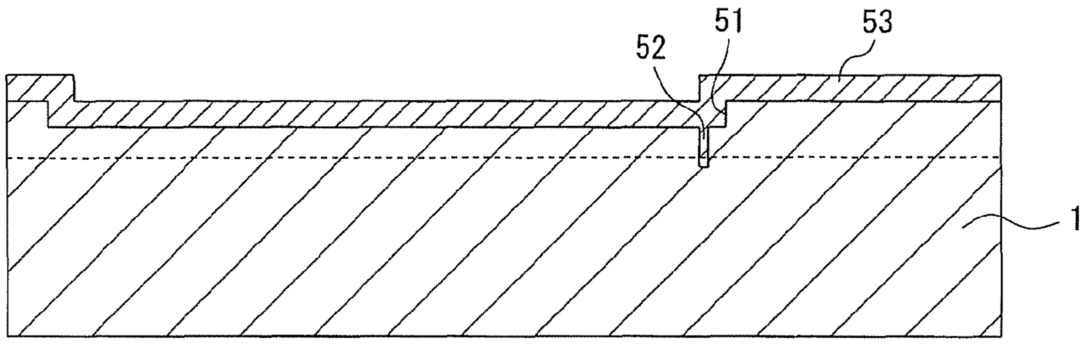
Figure 3A:
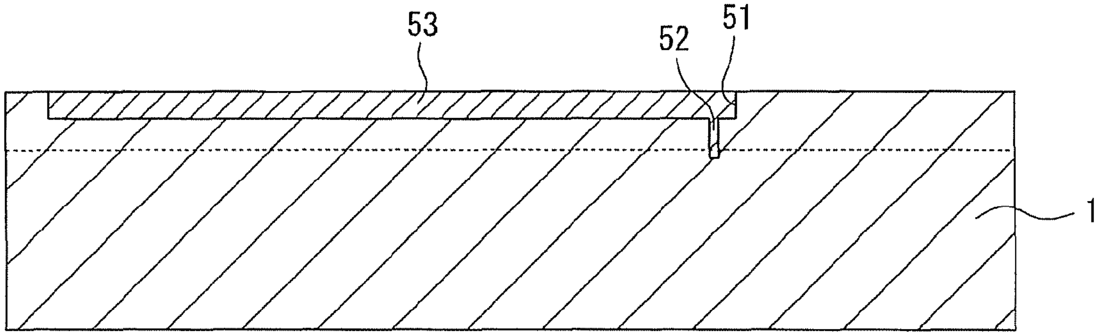
FIGS. 3A and 3B are drawings illustrating the method for manufacturing the inkjet recording head.

Thereafter, as shown in FIG. 2C, a sacrificial film 53 is formed on the entire surface of the substrate 1 so as to fill in the trenches 51 and 52. The thickness of the sacrificial film 53 is, for instance, approximately the same as or greater than the distance between the surface of the substrate 1 to the bottom surface of the trench 52. The sacrificial film 53 is then removed from the area excluding the trenches 51 and 52, by planarizing the sacrificial film 53 with, for instance, Chemical Mechanical Polishing (CMP). Consequently, the sacrificial film 53 remains only inside the trenches 51 and 52 as shown in FIG. 3A.

The sacrificial film 53 is removed in a subsequent process. Therefore, it is preferable to use a film with higher etching selectivity relative to that of the substrate 1 as the sacrificial film 53 (in other words, a film which is more easily etched than the substrate 1 in a predetermined etching condition). For instance, if the substrate 1 is made of Si, then the sacrificial film 53 may either be a $SiO_2$ film or a SiGe film. This $SiO_2$ film may also be a PSG film that has a relatively fast etching rate.

A method for forming the sacrificial film 53 is not limited to the above method, i.e. a combination of a film deposition process with CVD and a planarizing process with CMP. The sacrificial film 53 may be formed, for instance, by using a method called gas deposition or jet molding, in which a film is deposited by colliding ultra fine particles not greater than 1 μm with the substrate 1 in high speed using the pressure of a gas such as helium (He). Such a method allows for forming the sacrificial film 53 so as to bury (fill) it in the trenches 51 and 52 without undergoing the planarizing process with CMP.

Figure 3B:
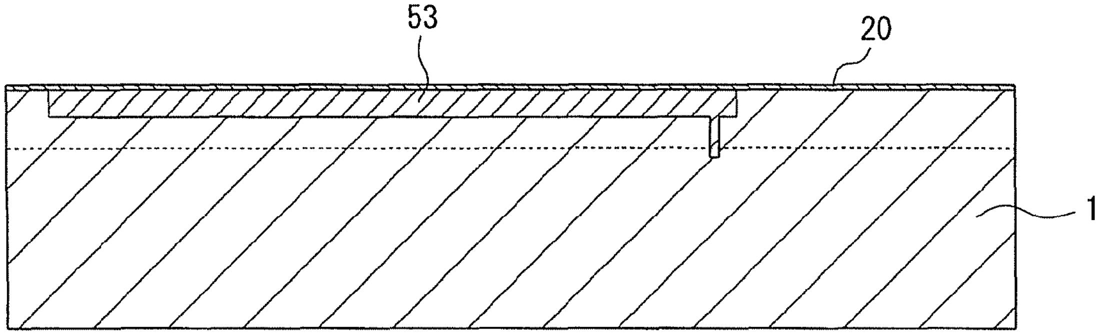

Subsequently, as shown in FIG. 3B, the diaphragm 20 is formed on the surface of the substrate 1 and on the sacrificial film 53. The diaphragm 20 is an elastic film as described, and is formed with, for instance, a $SiO_2$ film, a zirconium oxide ($ZrO_2$) film, or a multilayer film of the two, and the thickness of the diaphragm 20 is, for instance, 1 to 2 μm. If $ZrO_2$ is used in the diaphragm 20, $ZrO_2$ is formed, for instance, by sputter deposition (reactive sputter deposition) of zirconium (Zr) in an $O_2$ plasma. Alternatively, a Zr film may be formed on the surface of the substrate 1 as well as on the sacrificial film 53, and thereafter the Zr film is thermally oxidized in a diffusion furnace with a temperature of 500 to 1200° C., so as to form a $ZrO_2$ film. The material of the diaphragm 20 is not limited to the above, while it is preferable to use one that does not get etched or is less likely to be etched in the process of removing the sacrificial film 53.

Figure 4A:
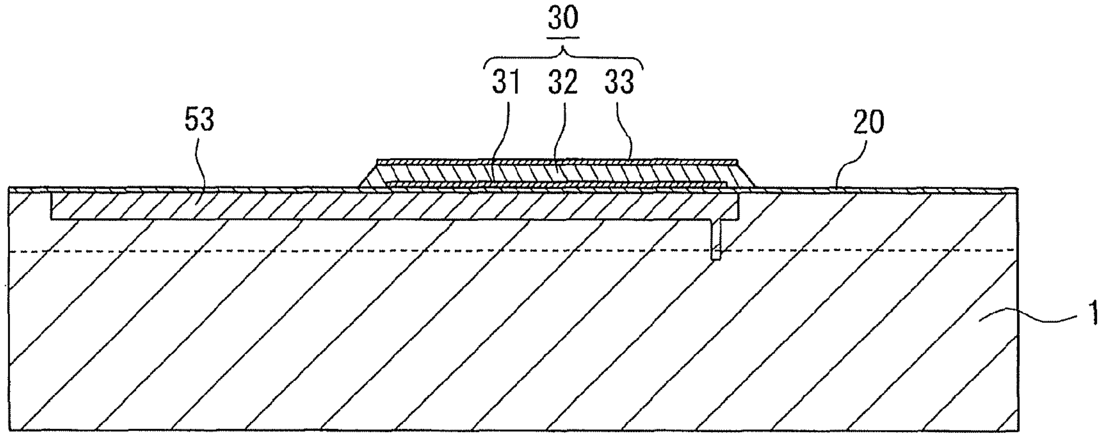
FIGS. 4A and 4B are drawings illustrating the method for manufacturing the inkjet recording head.

Thereafter, as shown in FIG. 4A, the piezoelectric elements 30 are formed on the diaphragm 20, each corresponding to the pressure generation chamber 10. Here, the lower electrode film is formed on the diaphragm 20 with, for instance, sputtering. The suitable materials of the lower electrode film include materials such as platinum (Pt) and iridium (Ir), since a later-described piezoelectric film deposited by sputtering or the sol-gel method needs to be fired and crystallized after the deposition, at a temperature of approximately 600 to 1000° C. under the atmospheric air or an oxygen atmosphere. The material for the lower electrode film needs to be selected so that the material maintains conductivity under conditions of high temperature and oxidized atmosphere. In particular, in case of using lead zirconate titanate (PZT) as the piezoelectric film, it is desirable to select a material with less conductivity change originating from the oxide lead diffusion. Materials such as Pt and Ir are suitable as materials that fulfill such conditions. Subsequently, the lower electrode film is partially etched by photolithography and etching techniques so as to form the lower electrode 31 having a shape of a common electrode.

The piezoelectric film is then deposited. Here, a piezoelectric film is formed with, for instance, the so-gel process in which a so-called sol that includes metal organics resolved or diffused in a medium is coated and dried to produce gel, and thereafter fired at a high temperature. Materials of PZT system are suitable for the piezoelectric film, and the firing temperature in this case is, for instance, approximately 700° C. The film deposition method of this piezoelectric film is not limited to the so-gel method, and may include, for instance, sputtering or spin coating such as the metal organic decomposition (MOD) method. Alternatively, the piezoelectric film may be formed by crystal growth at a low temperature with a high-pressure process in an alkali solution, after forming a PZT precursor film by any one of sol-gel, sputtering, and MOD methods. The thickness of the piezoelectric film formed with such methods is, for instance, between 0.2 and 5 μm.

Thereafter, the upper electrode film is deposited. Materials used for the upper electrode film include highly conductive materials such as conductive oxides and many of the metals, for instance, aluminum (Al), gold (Au), nickel (Ni) and platinum (Pt). Subsequently, the upper electrode film and the piezoelectric film are sequentially and partially etched by photolithography and etching techniques, so as to form the upper electrode 33 and the piezoelectric body 32 with a predetermined shape. Consequently, the piezoelectric elements 30, each including the lower electrode 31, the piezoelectric body 32, and the upper electrode 33, are completed on the diaphragm 20.

In this embodiment, the lower electrode 31 is the common electrode for the piezoelectric elements 30, and the upper electrode 33 is an individual electrode thereof. However, the common electrode and the individual electrode can be alternated in accordance with the arrangement of the driver circuit 42 and the interconnections. In other words, the lower electrode 31 may be the individual electrode and the upper electrode 33 may be the common electrode.

Figure 4B:
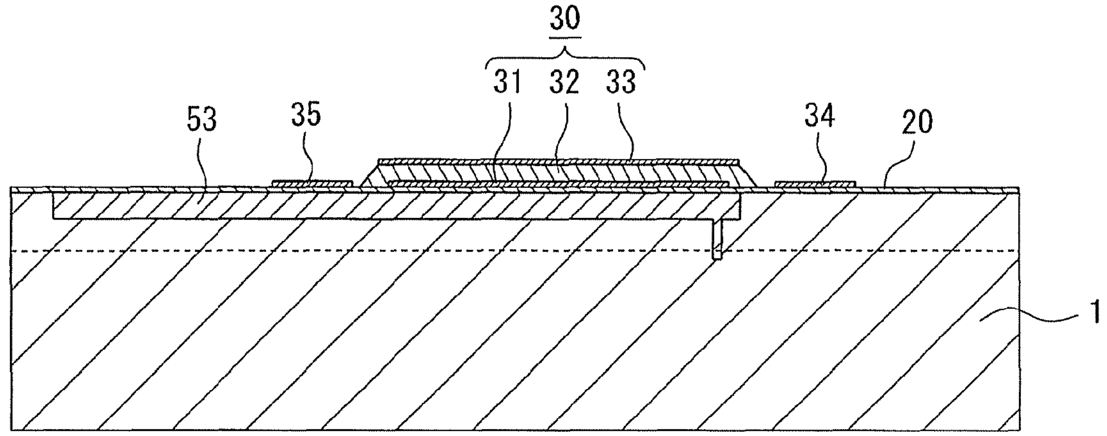

Thereafter, a conductive film is formed on the entire surface of the substrate 1. The conductive film is then partially etched by photolithography and etching techniques. Consequently, as shown in FIG. 4B, the interconnections 34 and 35 are formed, the interconnection 34 pulling out the lower electrode 31 (the common electrode) to the surface of the substrate 1, and the interconnection 35 pulling out the upper electrode 33 of each of the piezoelectric elements 30 to the surface of the substrate 1.

In this embodiment, prior to forming the interconnections 34 and 35, an un-illustrated process of forming a protection film may be carried out so as to cover the piezoelectric elements 30. The protection film is made of, for instance, alumina ($Al_2O_3$), and is formed with methods such as sputtering, Atomic Layer Deposition (ALD), and Metal Organic Chemical Vapor Deposition (MOCVD). As described, in the case of forming the protection film that covers the piezoelectric elements 30, the interconnections 34 and 35 are formed by partially etching the protection film with photolithography and etching so as to create contact holes on the lower electrode 31 and on the upper electrode 33, and thereafter filling these contact holes.

Figure 5A:
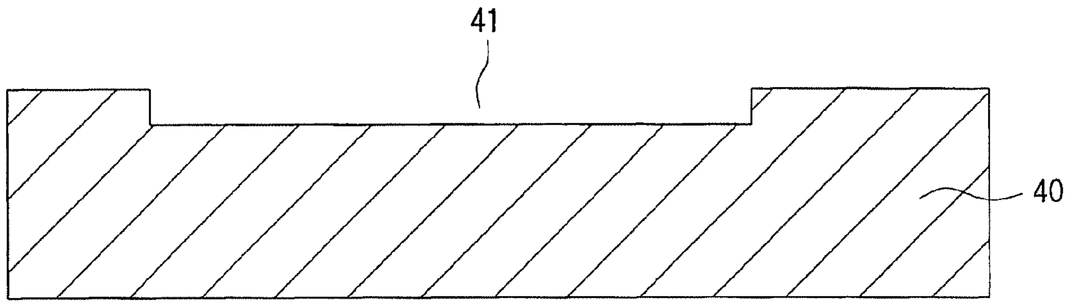
FIGS. 5A to 5C are drawings illustrating the method for manufacturing the inkjet recording head.

Subsequently, as shown in FIG. 5A, the sealing plate 40 that is made of, for instance, a bulk silicon, is prepared. The top surface of the substrate 40 is partially etched by photolithography and etching techniques, so as to form the recess 41 for sealing the piezoelectric element. Here, the recess 41 is formed so that the shape thereof is homothetic to the shape of the piezoelectric element in plan view, while the area size and depth of the recess 41 are larger than that of the piezoelectric element. This allows for forming the recess 41 in which the piezoelectric element is sealed in a state in which enough space is ensured so as not to inhibit the movement of the piezoelectric element.

Here, the piezoelectric element is sealed individually. Alternatively, a plurality of piezoelectric elements may also be arranged and collectively sealed inside a single recess 41. In this case, the recess 41 should be formed larger so that the plurality of piezoelectric elements can be sealed in together.

Figure 5B:
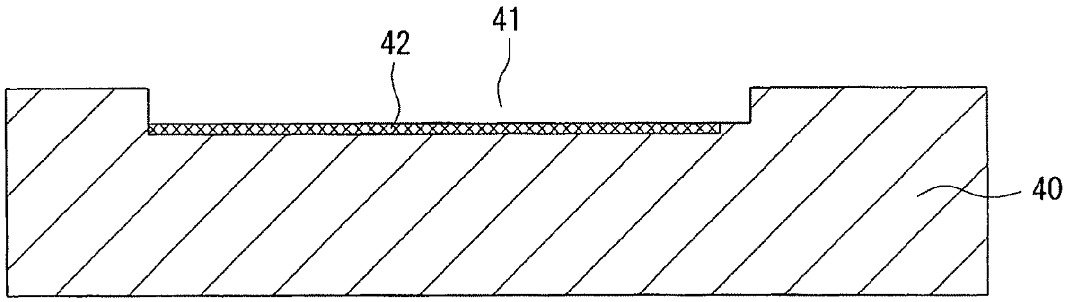
Figure 5C:
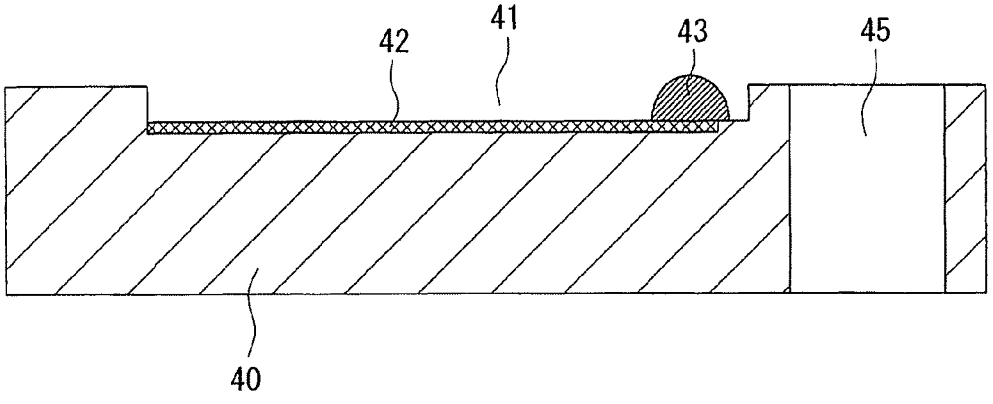

Subsequently, as shown in FIG. 5B, the driver circuit 42 for driving the piezoelectric elements 30 is formed on the bottom surface of the recess 41. This driver circuit 42 is formed with semiconductor processes, such as film deposition, photolithography, and etching. The bump electrodes 43 are then formed on the active surface of the driver circuit 42 as shown in FIG. 5C. One example for materials of the bump electrodes 43 includes Au.

As shown in FIG. 5C, the sealing plate 40 is then partially etched and is penetrated by photolithography and etching techniques, so as to form the reservoir 45 as a through hole. In this case, the reservoir 45 is formed, for instance, by wet etching using potassium hydroxide (KOH) solution or by dry etching.

Figure 6:
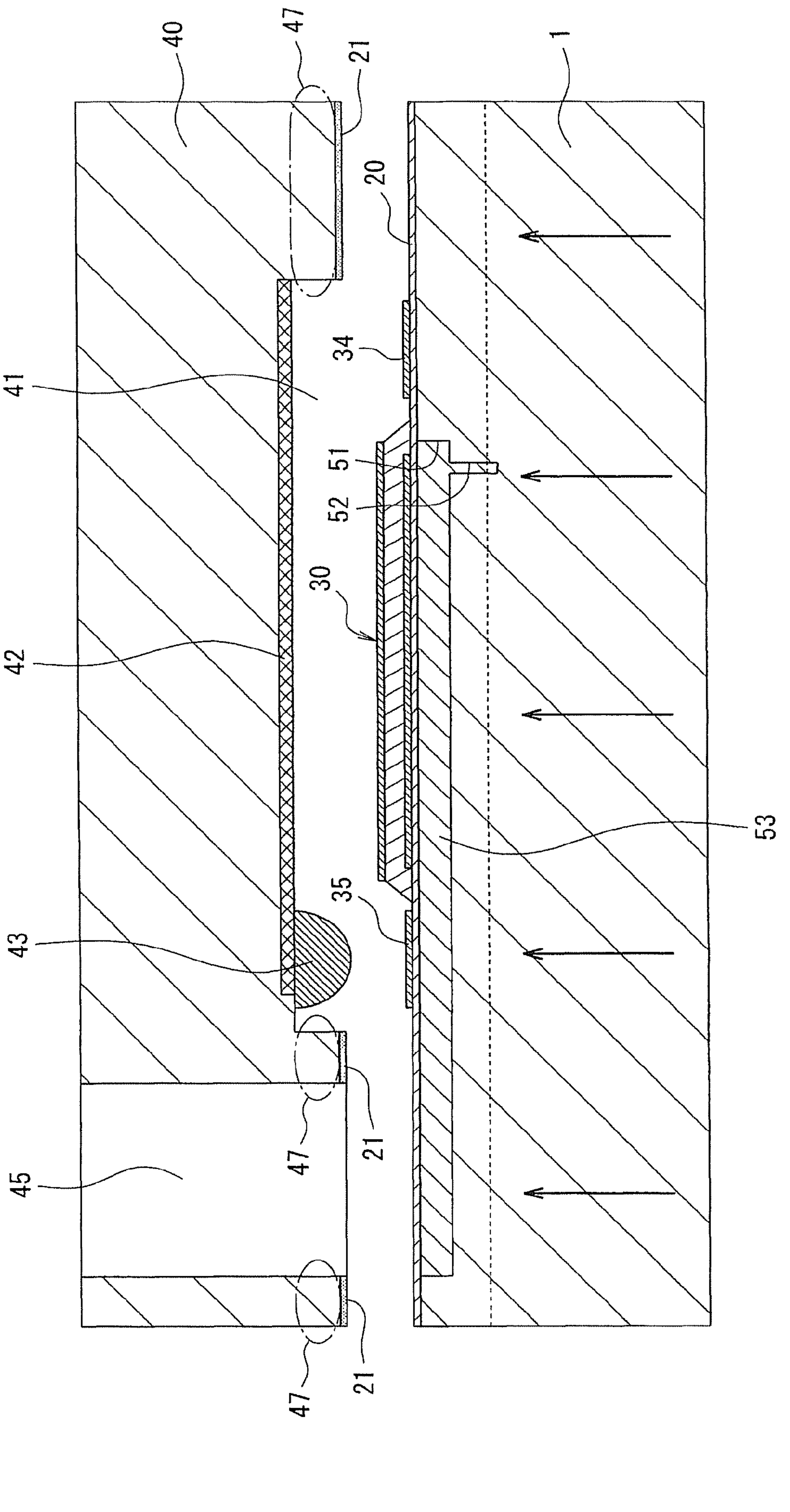
FIG. 6 is a drawing illustrating the method for manufacturing the inkjet recording head.
Figure 7A:
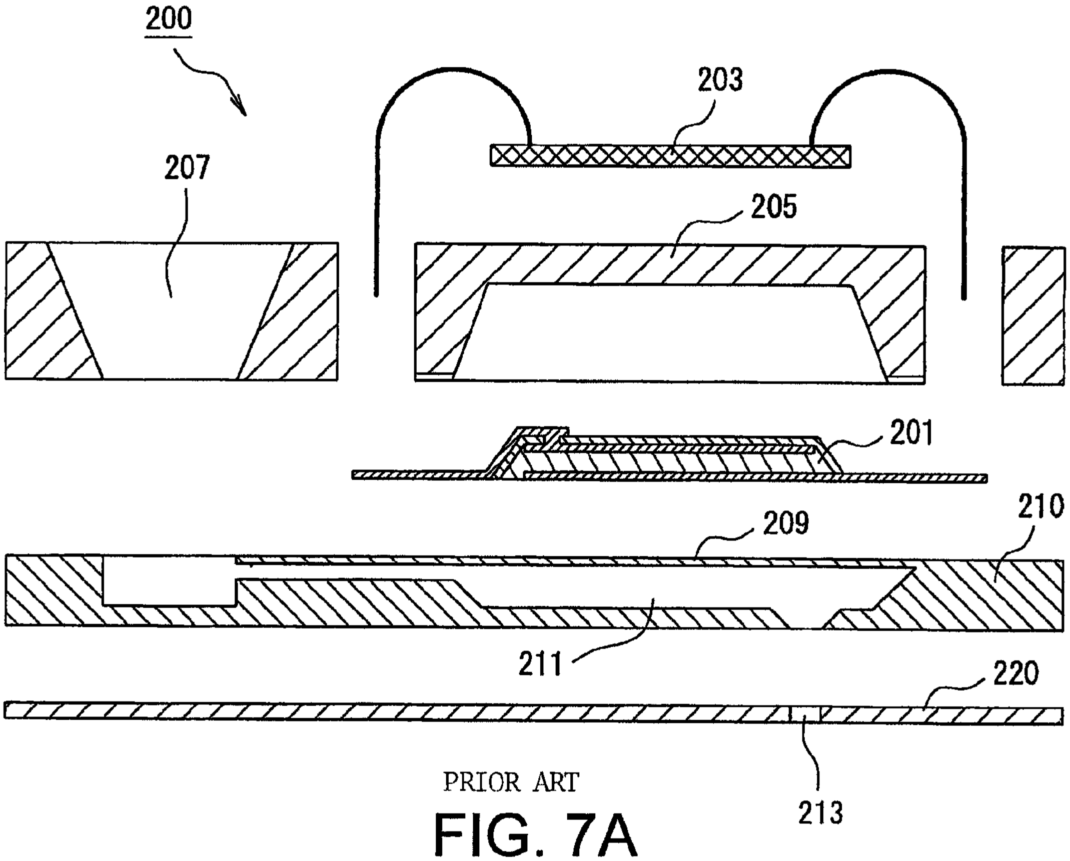
PRIOR ART FIG. 7A
FIGS. 7A and 7B are drawings illustrating a structural example of an inkjet recording head according to the related art.
Figure 7B:
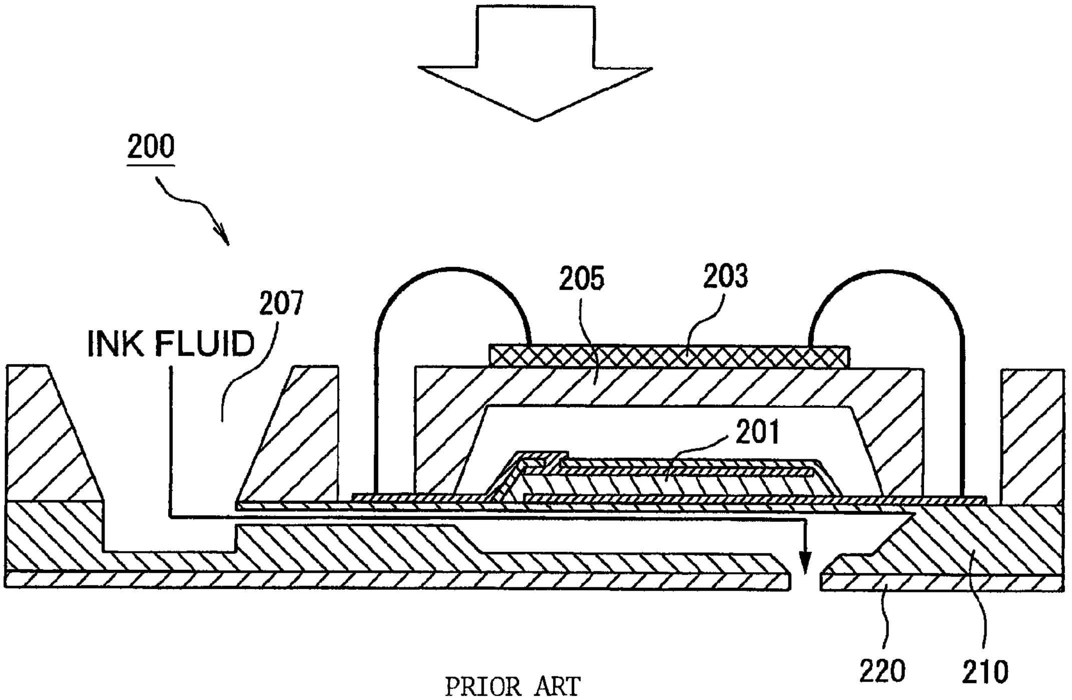
PRIOR ART FIG. 7B

Thereafter, as shown in FIG. 6, the surface of the sealing plate 40 in which the reservoir 45 is formed is bonded to the surface of the substrate 1 with an adhesive. Here, the sealing plate 40 and the substrate 1 are aligned so that the recess 41 properly overlays with each of the piezoelectric elements 30, and at the same time, the bump electrodes 43 properly overlay with the interconnections 34 and 35. In this state of alignment, the surface of the sealing plate 40 is bonded to the surface of the substrate 1. Consequently, each of the piezoelectric elements 30 is arranged and sealed inside the recess 41. At the same time, the bump electrodes 43 are electrically coupled to the interconnections 34 and 35. Moreover, the reservoir 45 is arranged to face the ink channel.

In the bonding process shown in FIG. 6, a raised portion 47 surrounding the recess 41 contacts the surface of the substrate 1, after the bump electrodes 43 contact the surfaces of the interconnections 34 and 35. Since the raised portion 47 contacts the surface of the substrate 1, a constant distance is ensured between the surfaces of the sealing plate 40 and that of the substrate 1, automatically determining the degree of deformation of the bump electrodes 43 formed on the bottom surface of the recess 41. Therefore, the degree of deformation of the bump electrodes 43 is evened out at the bottom surface of the recess 41, thereby reducing the fluctuation of the contact area of the bump electrodes 43 with the interconnections 34 and 35.

The bottom surface of the trench 52 is then opened by grinding the back surface of the substrate 1 as illustrated with arrows in FIG. 6 with, for instance, CMP. This grinding exposes part of the sacrificial film 53 from the back surface of the substrate 1, while, before or after the grinding, the diaphragm 20 is etched and removed with the sealing plate 40 as a mask, thereby forming an opening 46 (refer to FIG. 1) that exposes part of the sacrificial film 53. The sacrificial film 53 is then etched through the reservoir 45, the opening 46, and the bottom surface of the second trench 52 opened at the back surface of the substrate 1. As a result, the sacrificial film 53 is completely removed, thereby forming the pressure generation chamber 10 (refer to FIG. 1) and the nozzle opening 12 (refer to FIG. 1). Etching of the sacrificial film 53 may be any one of dry etching and wet etching. Here, the sacrificial film 53 is etched with etching gas or fluid that causes the sacrificial film 53 to be etched faster than the substrate 1. For instance, if the substrate 1 is made of Si and if the sacrificial film 53 is made of $SiO_2$, carbon tetrafluoride ($CF_4$) is an example of the etching gas that satisfies the above condition, and hydrogen fluoride (HF) solution is an example of the etching fluid that satisfies the same condition. Through the processes described above, the inkjet recording head 100 illustrated in FIG. 1 is completed.

The embodiment of the invention allows for arranging, on the surface of the substrate 1, the sealing plate 40 for sealing the piezoelectric elements 30 as well as for forming the reservoir 45. This embodiment also allows for arranging an open end of the nozzle opening 12 to the back surface of the first substrate 1. There is no need to arrange the sealing plate 40 on the back surface of the substrate 1, which allows the sealing plate 40 to be spaced away from the open end of the nozzle opening 12. Therefore, even if the adhesive 21 protrudes out beyond the bonding surface between the substrate 1 and the sealing plate 40, it is possible to prevent the clogging of the nozzle opening 12 caused by the excess adhesive 21. This allows for manufacturing the inkjet recording head in high yield. Mounting such an inkjet recording head to an inkjet recording device contributes to the price reduction of the inkjet recording device.

In this embodiment, the substrate 1, the surface thereof, and the back surface thereof respectively exemplarily correspond to the "first substrate", the "first surface of the first substrate", and the "second surface of the first substrate" in the invention. Moreover, the trench 51 and the trench 52 respectively exemplarily correspond to the "first trench" and the "second trench". Further, the driver circuit 42 exemplarily corresponds to the "integrated circuit".

The entire disclosure of Japanese Patent Application No. 2008-076377, filed Mar. 24, 2008 is expressly incorporated by reference herein.

What is claimed is:

1. A method for manufacturing an inkjet recording head which includes a pressure generation chamber supplied with ink fluid and a nozzle opening leading to the pressure generation chamber, the method comprising:

(a) forming a first trench which serves as the pressure generation chamber on a first surface of a first substrate;

(b) forming a second trench which serves as the nozzle opening on a bottom surface of the first trench;

(c) forming a sacrificial film on the first trench and the second trench;

(d) forming a diaphragm on the sacrificial film as well as on the first surface of the first substrate;

(e) forming a piezoelectric element on the diaphragm;

(f) grinding a second surface of the first substrate so as to open a bottom surface of the second trench;

(g) forming an opening which exposes the sacrificial film on the first surface of the first substrate; and (h) removing the sacrificial film through the opening.

2. The method for manufacturing an inkjet recording head according to claim 1, further comprising (i) bonding a second substrate that has a recess in an area facing the piezoelectric element to the first surface of the first substrate, so as to seal the piezoelectric element in the recess.

3. The method for manufacturing an inkjet recording head according to claim 2, further comprising forming, in the second substrate, a reservoir that leads to the pressure generation chamber.

4. The method for manufacturing an inkjet recording head according to claim 2, further comprising forming an integrated circuit on a bottom surface of the recess prior to step (i).

5. The method for manufacturing an inkjet recording head according to claim 4, further comprising:

forming a bump electrode on an active surface of the integrated circuit; and forming an interconnection leading to one of a lower electrode and an upper electrode of the piezoelectric element;

wherein, in step (i), the second substrate is bonded to the first surface of the first substrate in a state in which the bump electrode overlays the interconnection.

6. The method for manufacturing an inkjet recording head according to claim 1, wherein, in step (h), the sacrificial film is removed through the opening as well as through the bottom surface of the second trench opened on the second surface of the first substrate.

* * * * *